(12) United States Patent
Chen et al.

(10) Patent No.: US 11,887,974 B2
(45) Date of Patent: Jan. 30, 2024

(54) METHOD OF OPERATING MICROELECTRONIC PACKAGE

(71) Applicant: AP Memory Technology Corp., Zhubei (TW)

(72) Inventors: Wenliang Chen, Zhubei (TW); Lin Ma, Zhubei (TW); Alessandro Minzoni, Zhubei (TW)

(73) Assignee: AP Memory Technology Corp., Zhubei (TW)

( * ) Notice: Subject to any disclaimer, the term of this patent is extended or adjusted under 35 U.S.C. 154(b) by 0 days.

(21) Appl. No.: 17/591,561

(22) Filed: Feb. 2, 2022

(65) Prior Publication Data

US 2022/0157800 A1    May 19, 2022

Related U.S. Application Data

(63) Continuation of application No. 17/019,303, filed on Sep. 13, 2020, now Pat. No. 11,315,916, which is a
(Continued)

(51) Int. Cl.
*H01L 25/00*    (2006.01)
*H01L 25/18*    (2023.01)
*H01L 23/00*    (2006.01)

(52) U.S. Cl.
CPC ............ *H01L 25/18* (2013.01); *H01L 24/13* (2013.01); *H01L 24/16* (2013.01); *H01L 24/94* (2013.01); *H01L 25/50* (2013.01); *H01L 2224/13025* (2013.01); *H01L 2224/16146* (2013.01); *H01L 2224/16148* (2013.01)

(58) Field of Classification Search
CPC ......... H01L 23/00; H01L 25/00; H01L 25/18; H01L 25/50; H01L 24/13; H01L 24/16; H01L 24/94; H01L 2224/81; H01L 2224/94; H01L 2224/131; H01L 2224/13025; H01L 2224/16146; H01L 2224/16148; H01L 2924/00014;
(Continued)

(56) References Cited

U.S. PATENT DOCUMENTS 5,939,782 A    8/1999  Malladi
7,602,002 B2   10/2009 Inoue et al.
(Continued)

FOREIGN PATENT DOCUMENTS

WO    2018198330 A1    11/2018
WO    2020/005333 A1   1/2020

OTHER PUBLICATIONS

Roozeboom et. al., "Ultrahigh-density (> 0.4 μF/mm2) trench capacitors in silicon", First Int. Workshop on Power Supply on Chip (PowerSoC08), Cork, Ireland, Sep. 22-24, 2008.
(Continued)

*Primary Examiner* — Chuong A Luu
(74) *Attorney, Agent, or Firm* — Chen Yoshimura LLP

(57) ABSTRACT

A method of operating a microelectronic package includes a processing device stacking vertically with at least one memory device. The method includes a step of: reading data stored in a plurality of memory cells of a plurality of memory units of the memory device, with the processing device, with a plurality of signal channels each of which is dedicated to transmit signals from the processing device to one of the memory units and vice versa.

9 Claims, 7 Drawing Sheets

Related U.S. Application Data continuation of application No. 16/232,417, filed on Dec. 26, 2018, now Pat. No. 10,811,402.

(58) Field of Classification Search
CPC . H01L 2924/15311; H01L 2924/15192; H01L 2225/06541; H01L 2225/06513
USPC ..................................... 257/621; 438/14, 18
See application file for complete search history.

(56) References Cited

U.S. PATENT DOCUMENTS

| | | | |
|---|---|---|---|
| 8,845,854 | B2 | 9/2014 | Lei et al. |
| 9,130,057 | B1 | 9/2015 | Kumar et al. |
| 9,230,941 | B2 | 1/2016 | Chen et al. |
| 9,502,434 | B2 | 11/2016 | Tanaka et al. |
| 10,510,634 | B2 | 12/2019 | Lin et al. |
| 10,600,781 | B1 | 3/2020 | Xiao et al. |
| 2008/0203443 | A1 | 8/2008 | Wilson et al. |
| 2015/0318246 | A1 | 11/2015 | Yu et al. |
| 2015/0339201 | A1* | 11/2015 | Kanekawa .......... G06F 11/1616 714/6.11 |
| 2016/0012865 | A1 | 1/2016 | Lee et al. |
| 2016/0155722 | A1 | 6/2016 | Leedy |
| 2016/0336990 | A1 | 11/2016 | Petzold et al. |
| 2016/0358865 | A1 | 12/2016 | Shih et al. |
| 2017/0125436 | A1 | 5/2017 | Sharangpani et al. |
| 2019/0044764 | A1 | 2/2019 | Hollis et al. |
| 2019/0138412 | A1 | 5/2019 | Ogasawara |
| 2019/0304935 | A1 | 10/2019 | Collins et al. |
| 2020/0066668 | A1 | 2/2020 | Umemoto |
| 2020/0075534 | A1 | 3/2020 | Gao et al. |
| 2020/0098853 | A1 | 3/2020 | Haraguchi et al. |
| 2020/0103361 | A1 | 4/2020 | Wieczorek |
| 2020/0227366 | A1 | 7/2020 | Dogiamis et al. |
| 2020/0243455 | A1 | 7/2020 | Wang et al. |
| 2021/0134747 | A1 | 5/2021 | Yang |
| 2021/0242189 | A1 | 8/2021 | Or-Bach et al. |

OTHER PUBLICATIONS

Baker, "Benefits of Stacked-Wafer Capacitors for High-Frequency Buck Converters", Power SoC, Northeastern University, Boston, MA, Oct. 7, 2014.

Murata Manufacturing Co., Ltd., "3D Silicon Capacitors", Catsicap1. 5, Feb. 24, 2020. Available at https://www.murata.com/-/media/webrenewal/products/capacitor/siliconcapacitors/pdf/silicon-capacitors-cataloguev15murata.pdf.

Taiwanese Office Action, dated Oct. 29, 2021, in a counterpart Taiwanese patent application, No. TW 110113790. (Concise Summary of Taiwanese Office Communication and English translation of the search report are appended after the Chinese language document in the same PDF.).

* cited by examiner

METHOD OF OPERATING MICROELECTRONIC PACKAGE

PRIORITY CLAIM AND CROSS-REFERENCE

This application is a continuation of pending U.S. application Ser. No. 17/019,303, filed Sep. 13, 2020, which is a continuation of U.S. application Ser. No. 16/232,417, filed Dec. 26, 2018, the entire contents of which is incorporated herein by reference.

FIELD OF THE INVENTION

The present invention generally relates to a memory device and microelectronic package having the same. Specifically, the present invention generally relates to the memory device adapted to be stacked vertically with one another and microelectronic package having the same.

BACKGROUND OF THE INVENTION

Processors, such as SoC (System on Chip), Central Processing Unit (CPU), Graphics Processing Unit (GPU), Terminal Block Switch, etc., enables at least one of primary and peripheral functionality performed on specific electric apparatuses, such as mobile phones, tablets and laptop computers, etc. As the functionality of the electric devices increases to meet market requirements, the data storage capacity also increases to support such functionality.

One of the conventional solutions is a High Bandwidth Memory (HBM) 500 laterally positioned to a processor, such as a SoC die 600 as shown in FIG. 1. The HBM 500 has stacked DRAM architecture with core DRAM (Dynamic Random Access Memory) dies 510 on top of a base logic die 520. The SoC die 600 may access the data stored in the HBM 500 through the interconnection built by an interposer 700. The package substrate 800 provide a bonding interface with a Printed Circuit Board (PCB). The HBM 500 may increase the bandwidth up to 3 times as higher as unstacked DRAM but limited by a bottleneck due to a limited maximum number of channels between the HBM 500 and SoC die 600, which equals to the quotient of a width of the PHY area 521, 610 of the HBM 500 and SoC die 600 and a pitch of the interconnects. As one more DRAM die 11 is stacked/unstacked, the memory size that the HBM 500 provides increases/decreases one more total size of the DRAM die 510. Other than this, there is no way to customize the memory size the HBM 500 provides. Further, the cost and availability of the HBM 500 are other issues to be considered. Therefore, presenting a great memory size in view of the various relevant considerations and technical barriers is a challenge in the industry.

SUMMARY OF THE INVENTION

One aspect of the present invention is to provide a solution to enlarge the upper limit of the bandwidth a memory device or a microelectronic package having the same may present. With a novel structure in which a memory device is adapted to be stacked vertically, at least partially overlapped, with a processing device, a great potential for the bandwidth may be carried out.

Another aspect of the present invention is to provide a comparatively simple structure or assembly procedure for a memory device or a microelectronic package having the same with regard to one of the conventional technologies. For example, an interposer or a package substrate may be no longer required, the memory device may be integrated with the processing device, or the memory device may be assembled with the processing device by a wafer bonding process. Preferably, the cost may be reduced.

Yet, another aspect of the present invention is to provide a solution of elasticity in memory size a memory device or a microelectronic package having the same may provide. With dividing a memory device into a plurality of repeated memory units formed on the substrate, pieces of physical memory space may be presented for scalability to meet various needs of applications.

According to one embodiment of the invention, a memory device may be provided. The memory device, adapted to be stacked vertically with another memory device, may comprise a substrate and a plurality of memory units. The substrate may present a front surface and a back surface. Each of the memory units, formed on the front surface, may comprise a plurality of memory cells and a plurality of conductive interconnects electrically connected to the memory cells. In each of the memory units, the conductive interconnects contribute to a plurality of signal channels each of which is dedicated to transmit signals from an external interface to one of the memory units and vice versa.

According to another embodiment of the invention, a microelectronic package may be provided. The microelectronic package may comprise at least one memory device and a processing device. Each of the memory devices, adapted to be stacked vertically with one another, may comprise a substrate and a plurality of memory units. The substrate may present a front surface and a back surface. Each of the memory units, formed on the front surface, may comprise a plurality of memory cells and a plurality of conductive interconnects electrically connected to the memory cells. The processing device may be stacked vertically with the at least one memory device and electrically connected to the conductive interconnects. In each of the memory units, the conductive interconnects contribute to a plurality of signal channels each of which is dedicated to transmit signals from the processing device to one of the memory units and vice versa.

According to yet another embodiment of the invention, a method to assemble a microelectronic package may be provided. The method may comprise a step of stacking a processing device vertically with at least one memory device and electrically connected to conductive interconnects of one of the at least one memory device. Each of the at least one memory device may comprise a substrate and a plurality of memory units. The substrate may present a front surface and a back surface. Each of the at least one memory unit, formed on the front surface, may comprise a plurality of memory cells and a plurality of conductive interconnects electrically connected to the memory cells. In each of the memory units, the conductive interconnects contribute to a plurality of signal channels each of which is dedicated to transmit signals from the processing device to one of the memory units and vice versa.

According to yet another embodiment of the invention, a method of operating a microelectronic package is provided. The microelectronic package comprises a processing device stacking vertically with at least one memory device. The method comprising a step of: reading data stored in a plurality of memory cells of a plurality of memory units of the memory device, with the processing device, with a plurality of signal channels each of which is dedicated to transmit signals from the processing device to one of the memory units and vice versa.

BRIEF DESCRIPTION OF THE DRAWINGS

Various objects and advantages of the present invention will be more readily understood from the following detailed description when read in conjunction with the appended drawing, in which.

DESCRIPTION OF EMBODIMENTS OF THE INVENTION

For a more complete understanding of the present disclosure and its advantages, reference is now made to the following description taken in conjunction with the accompanying drawings, in which like reference numbers indicate like features. Persons of ordinary skill in the art having the benefit of the present disclosure will understand other variations for implementing embodiments within the scope of the present disclosure, including those specific examples described herein. The drawings are not limited to specific scale and similar reference numbers are used for representing similar elements. As used in the disclosures and the appended claims, the terms "example embodiment," "exemplary embodiment," and "present embodiment" do not necessarily refer to a single embodiment, although it may, and various example embodiments may be readily combined and interchanged, without departing from the scope or spirit of the present disclosure. Furthermore, the terminology as used herein is for the purpose of describing example embodiments only and is not intended to be a limitation of the disclosure. In this respect, as used herein, the term "in" may include "in" and "on", and the terms "a", "an" and "the" may include singular and plural references. Furthermore, as used herein, the term "by" may also mean "from", depending on the context. Furthermore, as used herein, the term "if" may also mean "when" or "upon", depending on the context. Furthermore, as used herein, the words "and/or" may refer to and encompass any and all possible combinations of one or more of the associated listed items.

Figure 1:
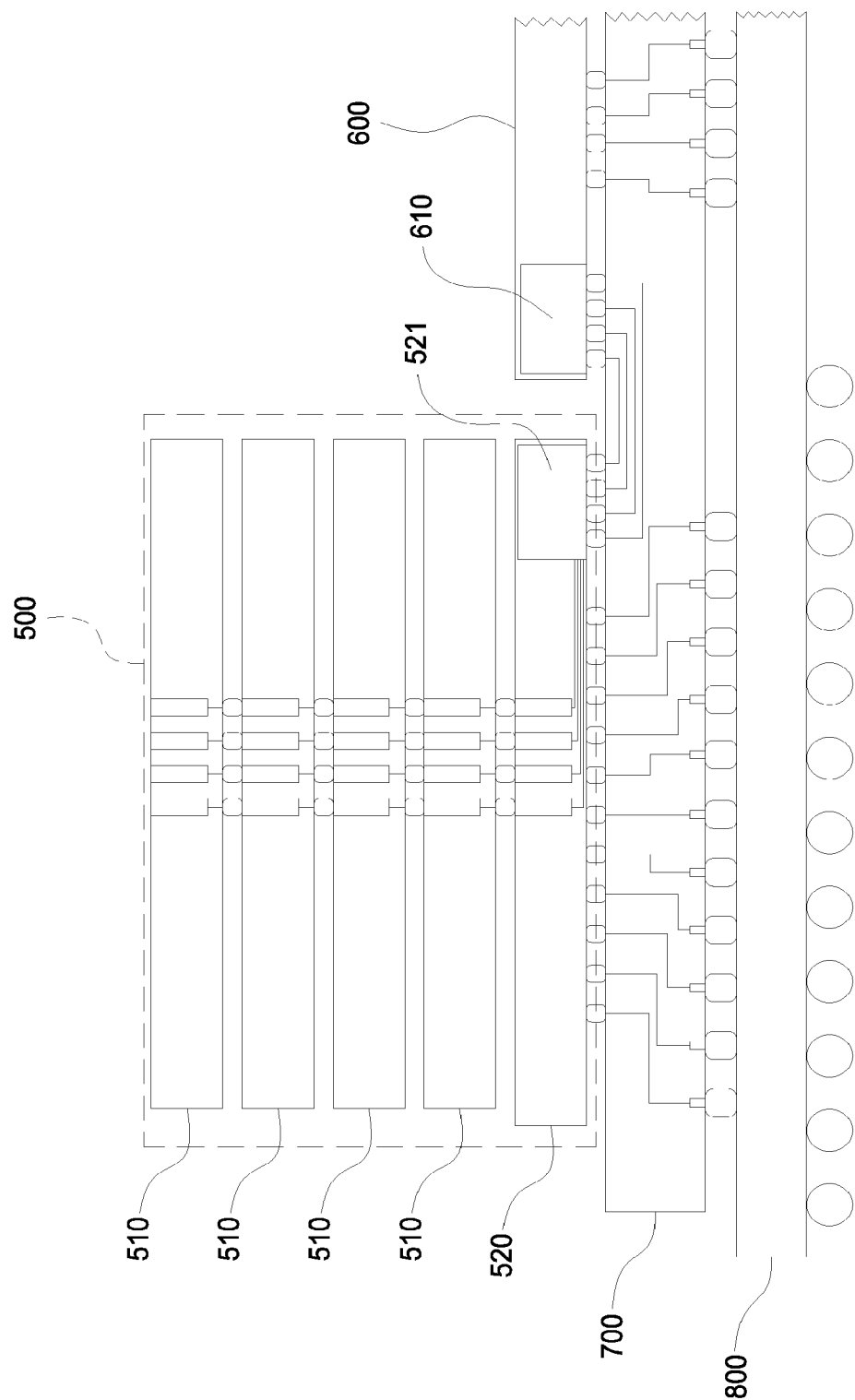
FIG. 1 shows a conventional structure of a HBM laterally positioned to a processor.
Figure 2A:
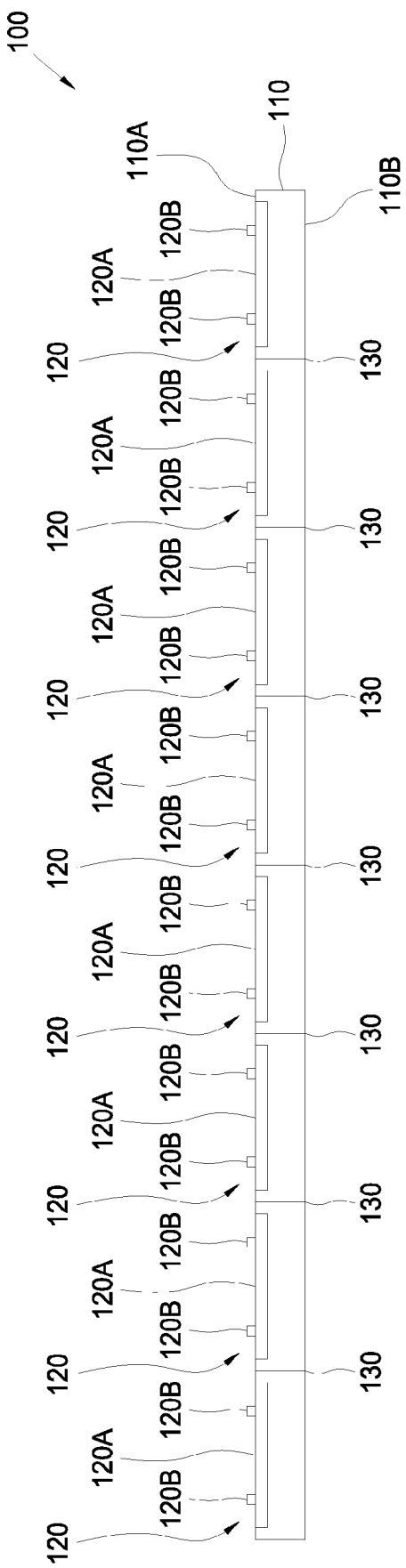
FIG. 2A shows a sectional view of a memory device in the form of wafer according to an embodiment of the present invention.
Figure 2B:
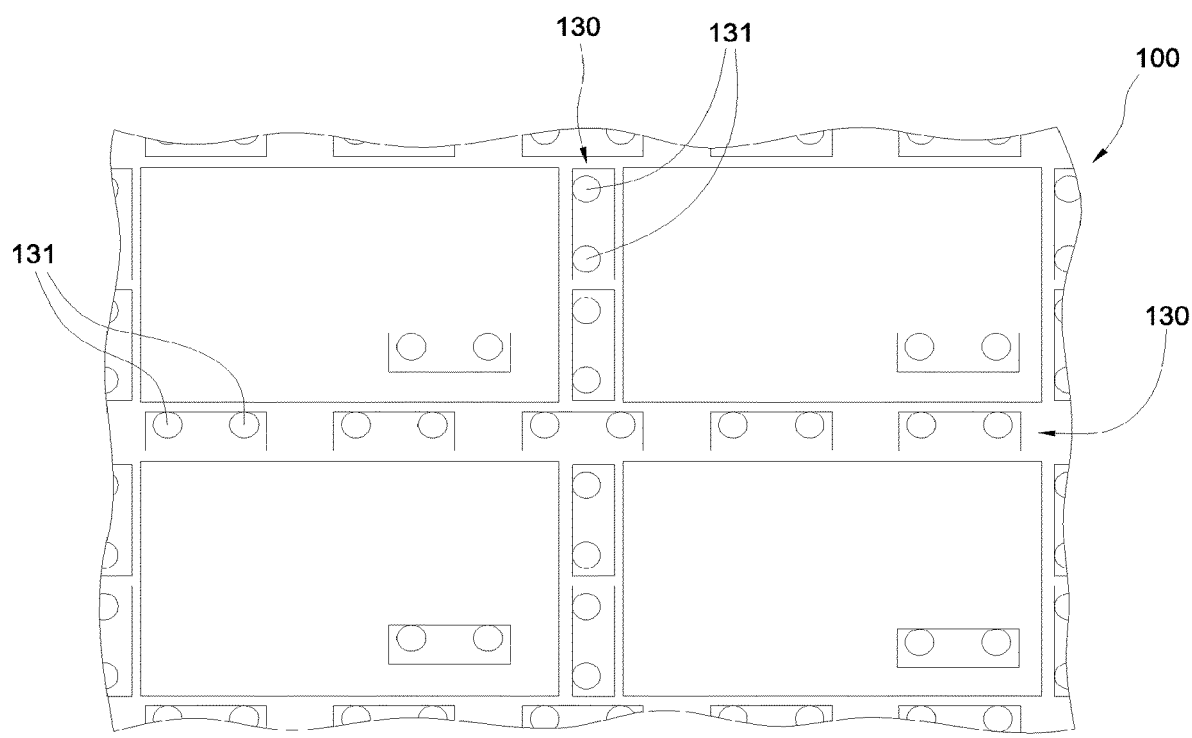
FIG. 2B shows a partial top view of a memory device according to an embodiment of the present invention.

Please refer to FIGS. 2A and 2B. In FIG. 2A, a sectional view of a memory device in the form of wafer according to an embodiment of the present invention is shown. In FIG. 2B, a partial top view of a memory device according to an embodiment of the present invention is shown. The memory device 100, either in the form of wafer or chip, may comprise a substrate 110, a plurality of memory units 120, a decoder circuit (not shown) and a local sensing amplifier (not shown). The substrate 110, for example made from silicon, glass or the like, may present a front surface 110A and a back surface 110B. The memory units 120, divided by a plurality of scribelines 130, may be formed on one of the front surface 110A and the back surface 110B, such as the front surface 110A. The number of the memory units 120 in the memory device 100 may be varied easily with cutting along with the scribelines 130 when the memory units 120 are in the form of wafer, and therefore the memory device 100 may be adapted to operate for providing a variable memory size which is an integer multiple of a unit size of the memory units 120, here for example, 6 (3×2), and in another example, 4 (2×2). Additional electrical devices may be optionally placed within the scribelines 130 to benefit the operation of the memory device 100. For example, several capacitors 131 may be formed therein as power supply decoupling capacitors for Vdd or Vss signals.

Each of the memory units 120 may comprise a plurality of memory cells 120A electrically connected to a plurality of conductive interconnects 120B. The memory cells 120A may be basic elements to store/retain electrical information in the memory device 100. Please note the structure, type, size, material, etc. of the memory cells 120A and the conductive interconnects 120B may be varied according to the requirements of a specific application. In the present embodiment, the memory cells 120A may be DRAM (Dynamic Random Access Memory) which may be constructed by a capacity and a transistor. The conductive interconnects 120B may be made from conductive substance, and preferably metal, alloy or the like. Here, for example, the conductive interconnects 120B comprise conductive contacts extending to the front surface 110A of the substrate 110.

The size of the memory cells 120A may be varied according to the requirements of a specific application in the design stage, for example, 64 Mb or 8 Mb. In each of the memory units 120, the conductive interconnects 120B contribute to a plurality of signal channels each of which is dedicated to transmit signals from an external interface to one of the memory units 120 and vice versa. Through the conductive interconnects 120B and the external interface, a processing device (not shown) may read/write the memory cells 120A of the memory units 120. In a memory unit 120, the number of the conductive interconnects 120B in a memory unit 120 is not limited to a specific integer. Here, for example, the conductive interconnects 120B may provide enough input/output signal channels for common 8-bit interface for command/address and data, differential clock and differential DQ strobe (DQS) for high speed double data-rate (DDR), DM for data masking, CE for chip select, etc.

Figure 3A:
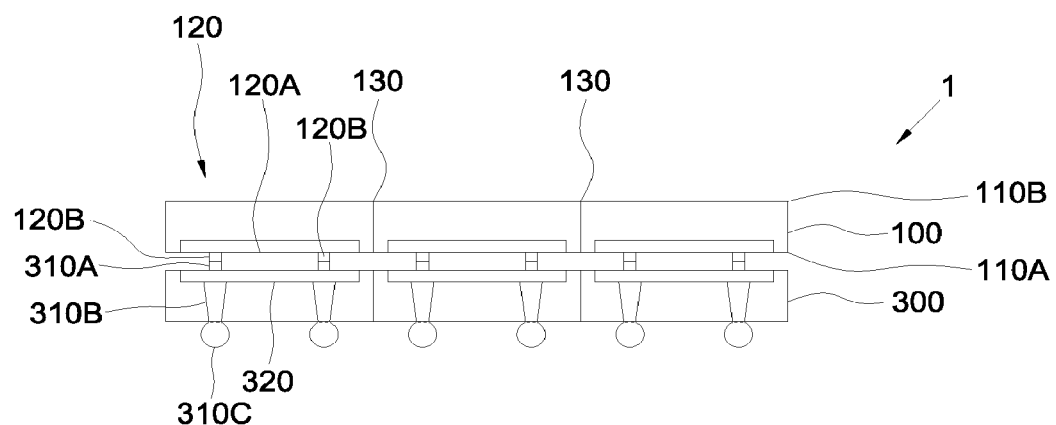
FIG. 3A shows a sectional view of a microelectronic package in which the memory device is stacked vertically with a processing device which electrically connected to the conductive interconnects according to an embodiment of the present invention.

The memory device 100 may be adapted to be stacked vertically with a processing device. The processing device may be but not limited to SoC (System on Chip), Central Processing Unit (CPU), Graphics Processing Unit (GPU), Terminal Block Switch, etc. In some implementations, the processing device may comprise neuro network artificial intelligence circuitry. To provide a function, the processing device 300 may access the memory device 100 for data storage. Please refer to FIG. 3A, showing a sectional view of a microelectronic package 1 in which the memory device 100 is stacked vertically with a processing device 300 which electrically connected to the conductive interconnects 120B according to an embodiment of the present invention. The conductive interconnects 120B are electrically connected with conductive contacts 310A on the front surface of the processing device 300. Through metal bumps 310C and through silicon vias 310B, external signals may be input into logic circuit 320 of the processing device 300 and result calculated by the logic circuit 320 of the processing device 300 may be output to an external device, such as a Printed Circuit Board (PCB). Therefore, in each of the memory units 120, the conductive interconnects 120B contribute to a plurality of signal channels each of which is dedicated to transmit signals from the processing device 300 to one of the memory units 120 and vice versa. Preferably, the shape and size of the processing device 300 may be substantially the same as those of the memory device 100. In such case, the memory device 100 in the form of wafer may be adapted to wafer-to-wafer bonding with the processing device 300 in the form of wafer to simplify the assembly process. Here, a front-to-front stacking wafer-to-wafer bonding is performed. In addition to wafer-on-wafer bonding, in some embodiments of the present invention, a chip-on-wafer bonding may be performed alternately. First, the memory device 100 may be diced into several memory chips which don't have to match the processing device 300 in size. Then, the smaller memory chips are mounted onto the wafer of the processing device 300 individually through the chip-on-wafer bonding process.

Figure 3B:
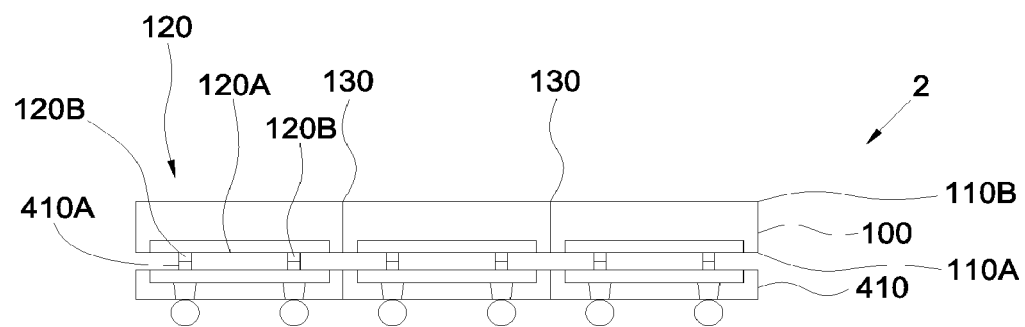
FIG. 3B shows another sectional view of a microelectronic package in which the memory device is stacked vertically with a processing device which electrically connected to the conductive interconnects according to another embodiment of the present invention.

Please refer to FIG. 3B for another sectional view of a microelectronic package 2 in which the memory device 100 is stacked vertically with a processing device 400 which electrically connected to the conductive interconnects 120B according to another embodiment of the present invention. Similar to the previous embodiment, the conductive interconnects 120B are electrically connected with conductive contacts 410A on a front surface of the processing device 400. The major difference is that TSV are formed after the wafer-to-wafer bonding process: a wafer of the memory device 100 was wafer-to-wafer bonding with another wafer of the processing device 400, the wafer of the processing device 400 was thinning, TSV are formed through a back surface of the wafer of the processing device 400, and then metal bumps are connected with the TSV.

In yet another embodiment, a processing device stacked vertically with a memory device may handle at least one function with regard to the operation of a memory and allow memory units of the memory device operating as raw memory blocks. The function for example may be memory power supply, memory redundancy repair, etc. Specifically, the memory power supply may be placed in the processing device. The memory redundancy repair may be implemented by performing a test on the memory cells in the memory units of all memory devices for one time or each time upon power-up, constructing a failure indication unit to indicate the failure found with the test, and constructing a memory redundancy repair logic to handle operation of accessing a particular address. The failure indication unit may comprise a data storage space storing an address in relation to the failure, and may be implemented by memory repair e-fuses, non-volatile memory such as flash, registers, internal memory, etc. Generally, the memory redundancy repair logic may check repaired addresses stored in the failure indication unit, and decide either (1) this location is not repaired, therefore access the original memory address directly; or (2) this location is repaired, therefore access the replacement address instead. Logically, the replacement may be implemented in several approaches. First, if one single bit of a memory unit is bad, the processing device may treat entire page with regard to the bit as bad. Second, if a signal channel is bad, the processing device may put the address of the signal channel in a channel failure table stored in the failure indication unit and remap the address to a spare good signal channel. Third, if a page is bad, the processing device may put the failed page address in a table stored in the failure indication unit and remap to a good spare page which may be located in a different signal channel. At least one of the memory units may be served as redundant spare and operated for replacing a failure of another one of the memory units. In another embodiment, the failure indication unit may be placed in the spare memory unit.

Figure 4:
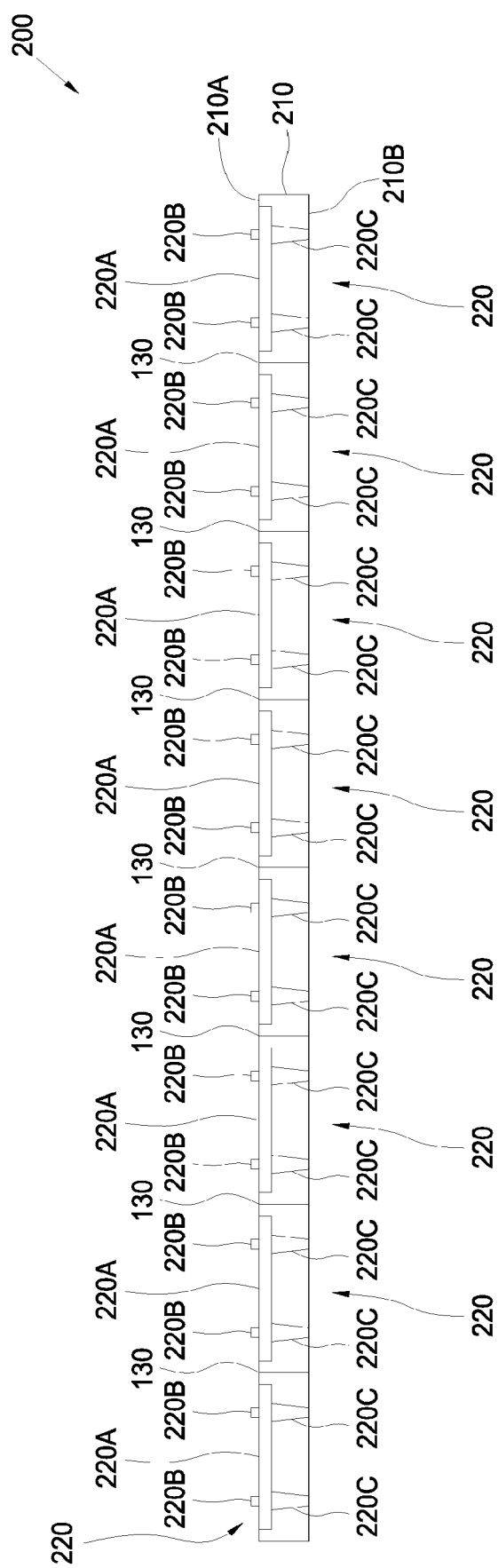
FIG. 4 shows a sectional view of a memory device in the form of wafer according to another embodiment of the present invention.
Figure 5:
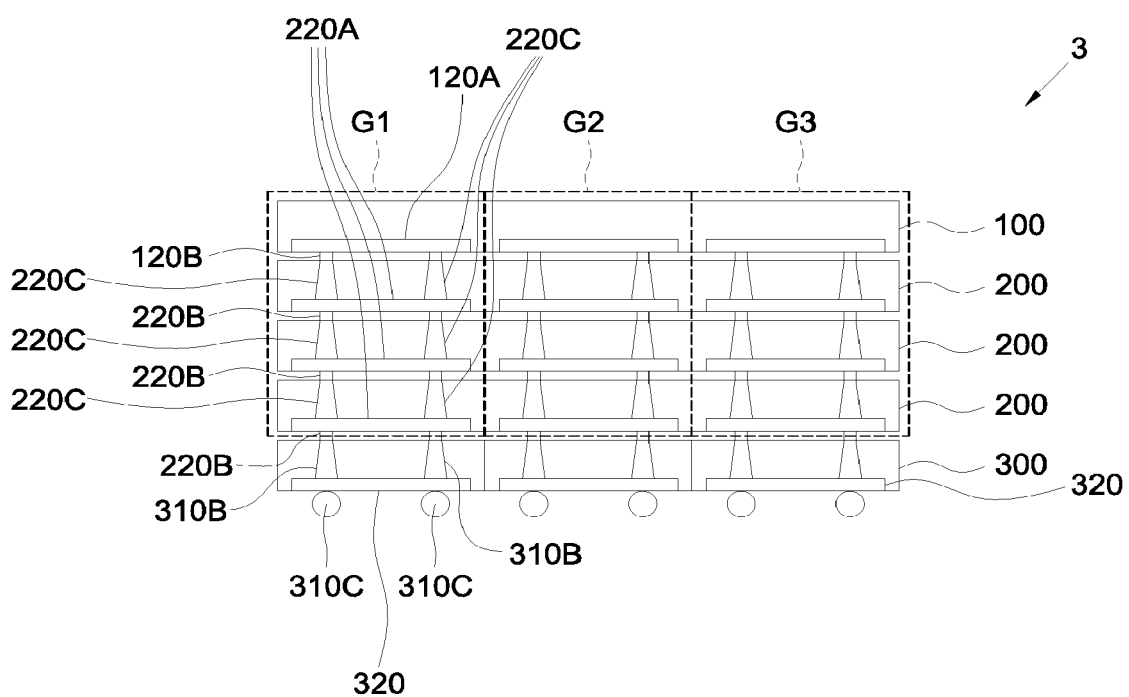
FIG. 5 shows yet another sectional view of a microelectronic package in which the memory devices are stacked vertically with a processing device which electrically connected to the conductive interconnects according to yet another embodiment of the present invention.

Please refer to FIGS. 4 and 5, in which FIG. 4 shows a sectional view of a memory device 200 in the form of wafer according to another embodiment of the present invention, and FIG. 5 shows yet another sectional view of a microelectronic package 3 in which the memory devices 100, 200 are stacked vertically with a processing device 300 which electrically connected to the conductive interconnects 220B according to yet another embodiment of the present invention. In the present embodiment, from bottom to top, a processing device 300, three memory device 200 and a memory device 100, which is also shown in FIG. 2A, are stacked vertically. The number of the memory devices 100, 200 may be varied. The structure of the memory device 200 is similar to that of the memory device 100, but the conductive interconnects in the memory device 200 may further comprise a plurality of TSV 220C extending to a back surface of a substrate. The conductive interconnects 120B and the conductive interconnects 220B are electrically connected with TSV 220C of the adjacent memory device 200. Through metal bumps 310C and through silicon vias 310B, external signals may be input into logic circuit 320 of the processing device 300 and result calculated by the logic circuit 320 of the processing device 300 may be output to an external device, such as a PCB. Preferably, the shape and size of the processing device 300 may be substantially the same as those of the memory devices 100, 200. In such case, the memory devices 100, 200 in the form of wafer may be adapted to wafer-to-wafer bonding with the processing device 300 in the form of wafer to simplify the assembly process. Here, several front-to-back stacking wafer-to-wafer bonding are performed.

Please note memory units 120, 220 of the memory devices 100, 200 are grouped into several vertical group of the memory units G1~G8. Each of the vertical group of the memory units G1/G2/G3/G4/G5/G6/G7/G8 may comprise a plurality of the memory units 120, 220 overlapped along a vertical direction. Each of signal channels, constructed by the conductive interconnects 120B, 220B and TSV 220C in a vertical group of the memory units G1/G2/G3/G4/G5/G6/G7G8 is dedicated to transmit signals from the processing device 300 to the vertical group of the memory units G1/G2/G3/G4/G5/G6/G7/G8 and vice versa.

As shown in FIGS. 3A, 3B and 5, because the memory device 100 is adapted to be stacked vertically with, at least partially and preferably entirely overlapped, the processing device 300/400, the maximum number of conductive interconnects therebetween may be increased, and therefore a great potential for the bandwidth may be carried out. The upper limit of the number may be increased up to the square of the quotient of a chip width of the memory device or the processing device and a pitch of the interconnects between the memory device and the processing device. Preferably, the bandwidth may be increased up to a thousand times but the power reduced to a fraction of those of a traditional HBM. Specifically, in some embodiments, a bandwidth density ratio of 2 GBps/64 Mb or 32 GBps/1 Gb or greater may be presented.

Figure 6:
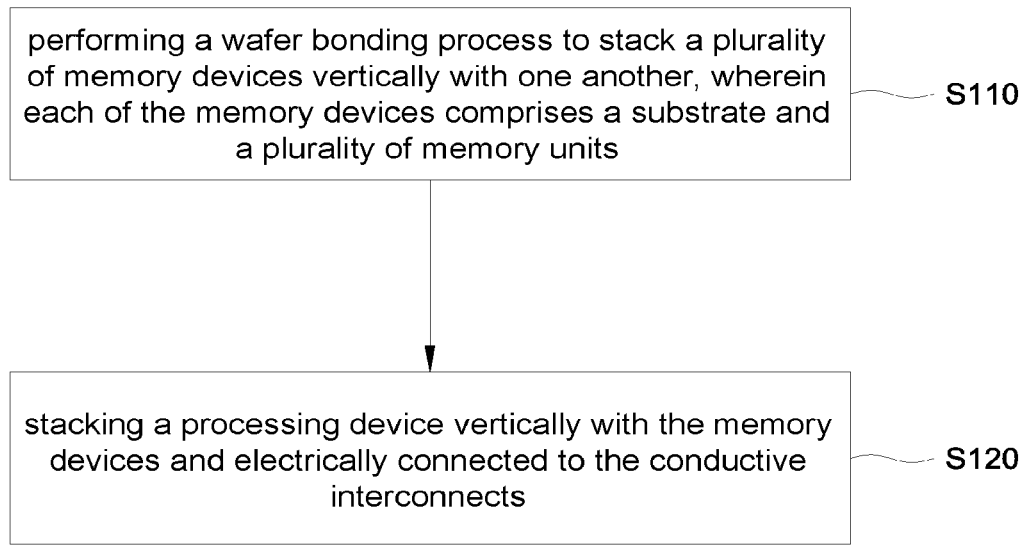
FIG. 6 shows a flow chart of a method to assemble a microelectronic package according to an embodiment of the present invention.

Please refer to FIG. 6, which shows a flow chart of a method to assemble a microelectronic package according to an embodiment of the present invention. The microelectronic package may comprise a plurality of memory devices and a processing device. The method may comprise a step of performing a wafer bonding process to stack a plurality of memory devices vertically with one another, wherein each of the memory devices comprises a substrate and a plurality of memory units (S110). The substrate may present a front surface and a back surface. Each of the memory units, formed on the front surface, comprises a plurality of memory cells and a plurality of conductive interconnects electrically connected to the memory cells. The method may further comprise a step of stacking a processing device vertically with the memory devices and electrically connected to the conductive interconnects (S120). The step may be performed by a wafer bonding process. In in each of the memory units, the conductive interconnects contribute to a plurality of signal channels each of which is dedicated to transmit signals from the processing device to one of the memory units and vice versa.

Therefore, compared with one of conventional technologies, the novel and comparatively simple structure and assembly procedure in which a memory device is adapted to be stacked vertically, at least partially overlapped, with a processing device according to the present invention, a great potential for the bandwidth may be carried out. A solution to enlarge the upper limit of the bandwidth of a memory device or a microelectronic package having the same may present. Further, an interposer or a package substrate may be no longer required, the memory device may be integrated with the processing device, or the memory device may be assembled with the processing device by a wafer bonding process. Preferably, the cost may be reduced. Additionally, with dividing a memory device into a plurality of repeated memory units formed on the substrate, pieces of physical memory space may be presented for scalability to meet various needs of applications.

While various embodiments in accordance with the disclosed principles are described above, it should be understood that they are presented by way of example only, and are not limiting. Thus, the breadth and scope of example embodiment(s) should not be limited by any of the above-described embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically, a description of a technology in the "Background" is not to be construed as an admission that technology is prior art to any invention(s) in this disclosure. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings herein.

What is claimed is:

1. A method of operating a microelectronic package, comprising a processing device stacking vertically with at least one memory device, the method comprising steps of:
   reading data stored in a plurality of memory cells of a plurality of memory units of the memory device, with the processing device, with a plurality of signal channels each of which is dedicated to transmit signals from the processing device to one of the memory units and vice versa;
   performing a test, with the processing device, on the memory cells in the memory units of the at least one memory device; and
   indicating a failure found with the test, with the processing device.

2. The method of operating a microelectronic package according to claim 1, further comprising:
   performing the test, with the processing device, on the memory cells in the memory units of the at least one memory device for one time or each time upon power-up of the microelectronic package.

3. The method of operating a microelectronic package according to claim 1, further comprising:
   arranging at least one memory unit in the plurality of memory units to be redundant spare for replacing a failure memory unit.

4. The method of operating a microelectronic package according to claim 1, wherein the step of indicating an address of a failure found with the test with a failure indication unit further comprising: storing an address in relation to the failure in a data storage space of a failure indication unit.

5. The method of operating a microelectronic package according to claim 4, further comprising:
   checking an address of one of the memory cells with the address in relation to the failure in the failure indication unit, with a memory redundancy repair logic, to identify if the address of the one of the memory cells is repaired.

6. The method of operating a microelectronic package according to claim 5, further comprising:
   accessing the address of one of the memory cells directly when the address of the one of the memory cells is not repaired; and
   accessing an replacement address when the address of the one of the memory cells is repaired.

7. The method of operating a microelectronic package according to claim 1, further comprising:
   indicating an address of a failed signal channel in a failure indication unit, with the processing device; and
   remapping the address of the failed signal channel to a good signal channel, with the processing device.

8. The method of operating a microelectronic package according to claim 1, further comprising:
   if a bit of a memory unit in the plurality of memory units is bad, treating an entire page of the bad bit as a bad page, with the processing device.

9. The method of operating a microelectronic package according to claim 1, further comprising:
   putting a failed page address in a table stored in a failure indication unit, with the processing device; and
   remapping the failed page address to a good spare page, with the processing device.

\* \* \* \* \*